US 6,711,059 B2

(12) United States Patent
Sinclair et al.

(10) Patent No.: US 6,711,059 B2
(45) Date of Patent: Mar. 23, 2004

(54) MEMORY CONTROLLER

(75) Inventors: Alan Welsh Sinclair, Edinburgh (GB); Peter John Smith, Midlothian (GB); Robert Edwin Payne, Edinburgh (GB)

(73) Assignee: Lexar Media, Inc., Fremont, CA (US)

( * ) Notice: Subject to any disclaimer, the term of this patent is extended or adjusted under 35 U.S.C. 154(b) by 0 days.

(21) Appl. No.: 10/260,135

(22) Filed: Sep. 27, 2002

(65) Prior Publication Data

US 2003/0156473 A1 Aug. 21, 2003

(51) Int. Cl.[7] .............................................. G11C 16/04
(52) U.S. Cl. .............................. 365/185.11; 365/185.33; 714/38
(58) Field of Search ...................... 365/185.05, 185.11, 365/185.33; 714/38

(56) References Cited

U.S. PATENT DOCUMENTS 6,069,827 A  *  5/2000  Sinclair ................. 365/185.29

* cited by examiner

Primary Examiner—Vu Anh Le
(74) Attorney, Agent, or Firm—Law Offices of Imam

(57) ABSTRACT

According to a first aspect of the present invention, there is provided a memory system having a controller and a non-volatile memory storing firmware for start up and for normal operation of the system, the controller comprising, a volatile memory; and a processor; wherein the controller is arranged to operate during initialization or configuration of the system so that the start up firmware stored in the non-volatile memory is loaded into the volatile memory under hardware control by the controller and with the processor halted, the start up firmware in the volatile memory being subsequently executed by the processor.

3 Claims, 8 Drawing Sheets

MEMORY CONTROLLER

CROSS REFERENCE TO RELATED APPLICATION

This application claims the benefit of the priority date of our earlier filed British Application No. 0123422.8, entitled "Improved Memory Controller", filed on Sep. 28, 2001.

BACKGROUND OF THE INVENTION

1. Field of the Invention

The present invention relates generally to flash memory systems including controllers for controlling flash memory devices and particularly to a memory controller for controlling access to non-volatile memory device(s) of a solid state memory system.

2. Description of the Prior Art

Within the electronics industry, the use of solid state memory systems to try to emulate magnetic disc storage systems in computer systems is known. However, the cost of solid state memory systems prevents compatability between the two systems.

In solid state memory systems, it is known for firmware to be executed by a microprocessor within a controller to be stored in a Read Only Memory (ROM) within the controller. Such firmware may allow the controller to manage the solid state storage medium according to algorithms which create the logical characteristics of a magnetic disk device. The ROM may be of several forms, such as mask programmable ROM or flash ROM. In each case, the ROM adds substantially to the cost of the solid state storage system. A mask programmable ROM has the additional disadvantage of being very inflexible as its contents are fixed and may only be changed by a change to the controller design. The use of a flash ROM within the controller has the drawback of adding considerably to the complexity of the manufacturing process for a controller integrated circuit. Therefore, increasing the cost of storing firmware for execution by a processor, within a controller, for flash memories, adds to the increased cost of such solid state memory systems over magnetic disk storage systems.

In a development to provide an improved system, U.S. Pat. No. 5,606,660, entitled "Method and Apparatus for Combining Controller Firmware Storage And Controller Logic In A Mass Storage System", issued on Feb. 25, 1997 to Estakhri et al., describes an arrangement wherein firmware code is loaded from flash memory to a volatile memory within the controller. This is done under the control of a processor in the controller, which executes firmware code stored in a ROM within the controller. However, this arrangement has the disadvantage that a ROM is required within the controller, the contents of which cannot be modified without changing the controller design. Thus, the cost of such a solid state memory system is still higher than a magnetic disc storage system.

Thus, a need arises to obviate or mitigate at least one of the aforementioned problems.

SUMMARY OF THE INVENTION

According to a first aspect of the present invention, there is provided a memory system having a controller and a non-volatile memory storing firmware for start up and for normal operation of the system, the controller comprising, a volatile memory; and a processor; wherein the controller is arranged to operate during initialization or configuration of the system so that the start up firmware stored in the non-volatile memory is loaded into the volatile memory under hardware control by the controller and with the processor halted, the start up firmware in the volatile memory being subsequently executed by the processor.

Preferably the volatile memory is of a size that only a part of the total firmware contained in the non-volatile memory can be contained in the volatile memory at any one time, said part being sufficient to accommodate the start up firmware.

Conveniently, the controller is arranged to operate after start up such that firmware code executed by the processor from volatile memory from time to time loads further firmware code from the non-volatile memory to the volatile memory for subsequent execution by the processor.

The foregoing and other objects, features and advantages of the present invention will be apparent from the following detailed description of the preferred embodiments which make reference to several figures of the drawing.

IN THE DRAWINGS

DETAILED DESCRIPTION OF THE PREFERRED EMBODIMENTS

The present invention in particular relates to Flash memory systems and to a controller operating in conjunction with Flash memories (which are non-volatile). However, various types of Flash memory devices based on NAND type memory cells, AND type memory cells, or NOR type memory cells. Such devices may have different types of interfaces to controllers with which they may use a serial access type of interface (as commonly used in many NAND and AND type devices) or a random access type interface (as used in some NOR type devices). The present invention, in appropriate form is applicable to each of these different types of memory devices.

The host system to which the memory controller and system of the present invention may be connected can be of two different types, that is an end user system in which a Flash memory system is used as a storage device, and a test system which is used to test format and program a Flash card as part of the card's manufacturing process.

Figure 1:
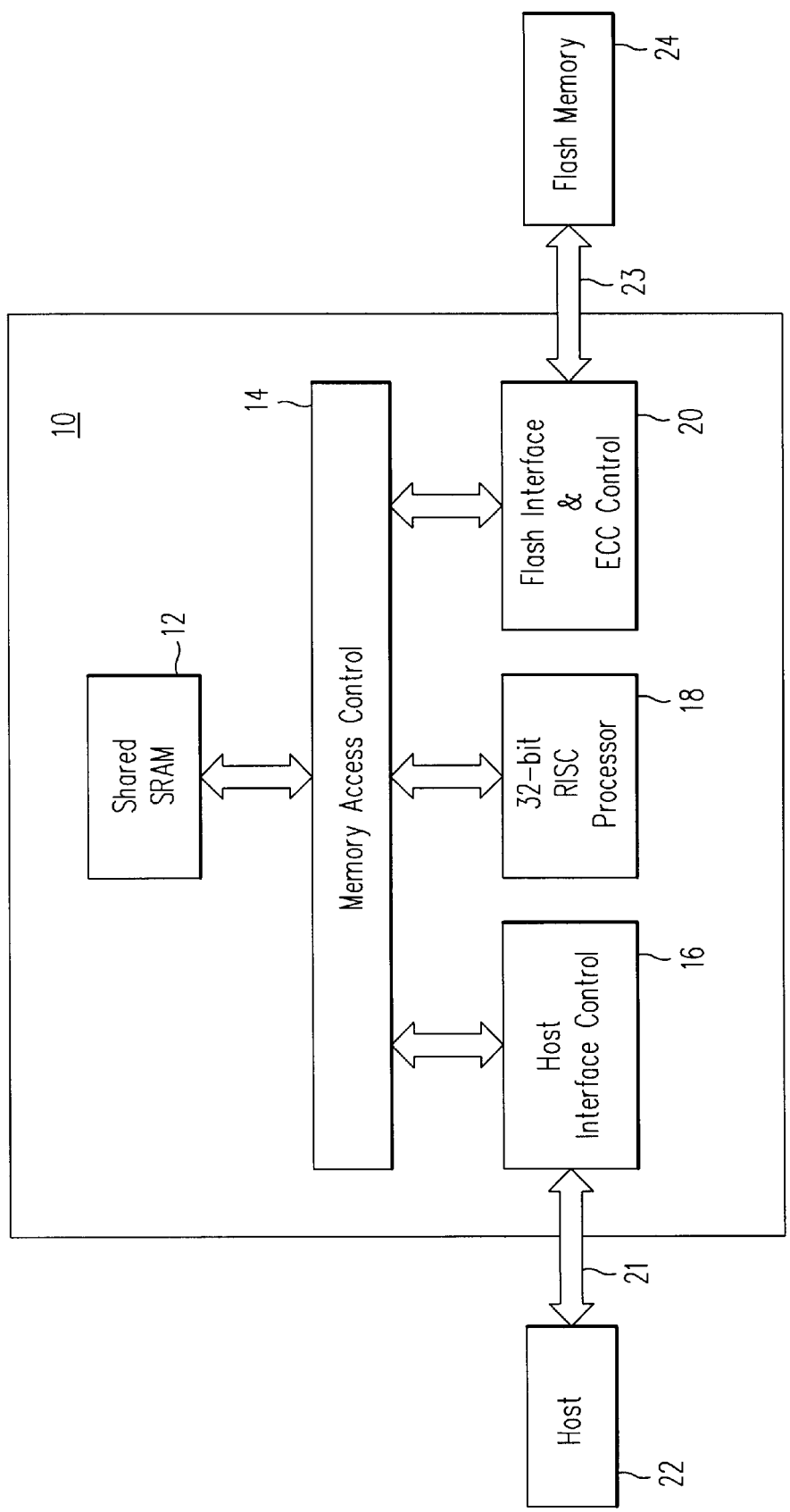
FIG. 1 is a schematic representation of the hardware architecture of a memory controller according to a first embodiment of the present invention.

With reference to FIG. 1 there is shown a memory controller 10, which operates within a memory system comprising a host 22 and a non-volatile memory, in this case a Flash memory 24. The memory controller 10 comprises a volatile memory, in this case an SRAM 12, a memory access control unit 14, a microprocessor 18, in this case a 32 bit RISC Processor, a host interface control unit 16 and a memory interface and ECC control unit 20. A host interface 21 connects host 22 to the host interface control unit 16. A Flash interface 23 connects Flash memory 24 to the Flash interface and ECC control unit 20. In what is described as normal operation (see FIG. 4), the microprocessor is executes firmware code in the SRAM 12. The memory system comprising controller 10 and the solid state memory, that is Flash memory 24, thus emulates a disc memory.

The firmware code which is stored in Flash memory 24 in partitioned into code for start up and code for normal operation of the system and is divided into code pages, each of which is 512 bytes long. Typically the controller design determines that the maximum number of code pages is limited to 128 (64K bytes). At any point in time up to 24 code pages can be held in SRAM code space, which exists together with data and stack space, within the SRAM 12. The SRAM code space is divided into SRAM code pages. When a code page is loaded into SRAM 12 this is done without overlapping SRAM code page boundaries. After programming (see FIG. 4), firmware is permanently stored in the Flash memory 24 and each firmware code page occupies 528 Bytes made up from 512 bytes of code, 4 bytes of header and 12 bytes of ECC. These blocks of 528 bytes are referred to as Flash code pages. The Flash memory 24 is physically divided into flash pages that have a length which is a multiple of 528 Bytes, for instance NAND flash pages are the 528 bytes. Each flash page may include several flash code pages and the starting point for any particular flash code page is identified as a flash page offset.

Multiple copies of firmware are stored in Flash memory 24 to provide protection against memory failures. Typically the firmware codes formatted to ensure that each copy of a particular code page is located in the same chip of the Flash memory 24 at a flash code page, which is 2048 pages above the previous copy. This means that the copies of firmware are repeated every 2048 flash code pages, which holds true regardless of the number of flash chips used to store firmware or of the flash page size. The first copy of firmware starts at flash code page 0. Up to eight separate copies of firmware code can be accommodated in Flash memory 24, but only two copies are normally used.

Figure 2:
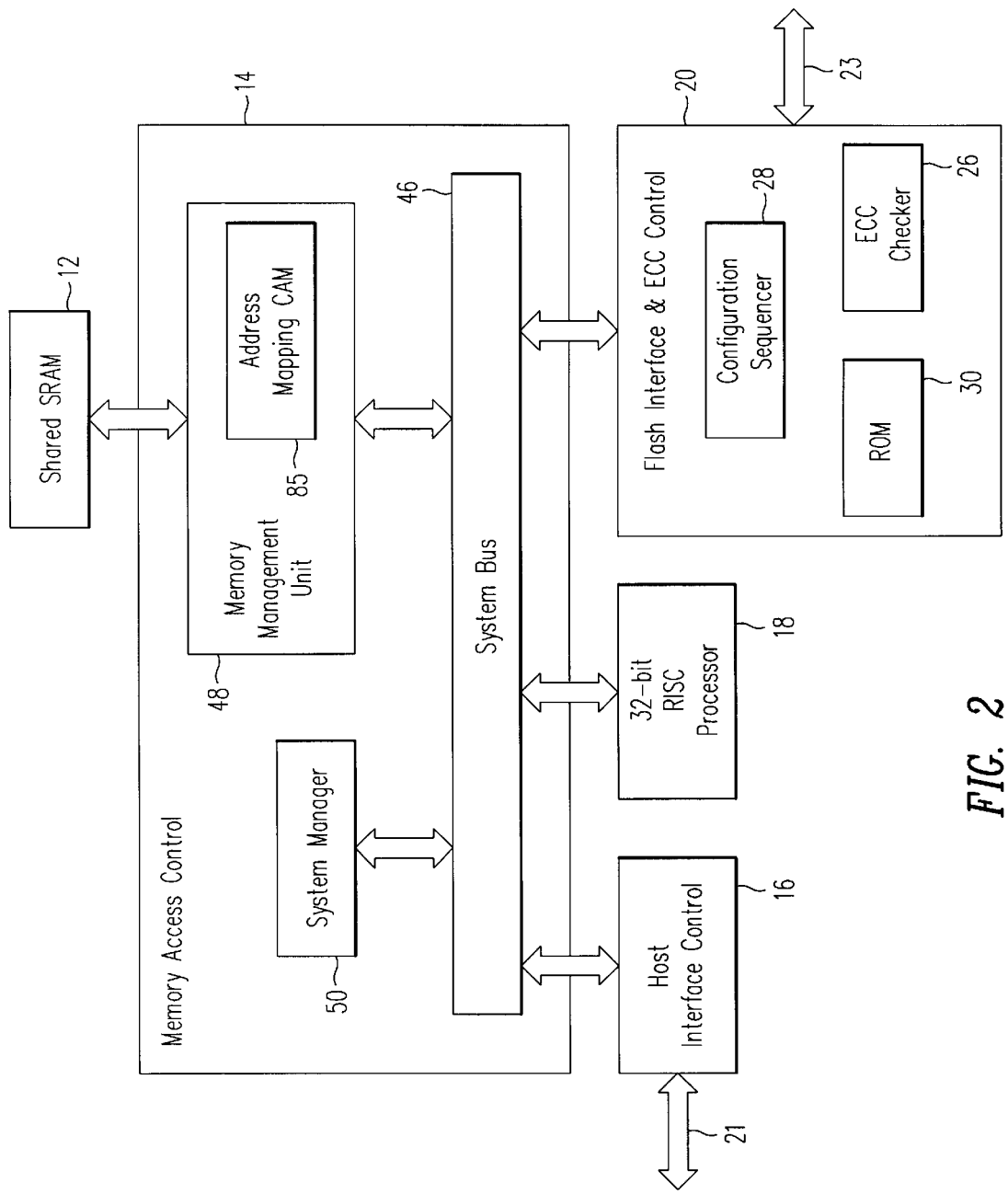
FIG. 2 is a schematic representation of components within the memory controller of FIG. 1.

With reference to FIG. 2, memory access control unit 14 includes system bus 46 incorporating logic for bus arbitration, address decode and multiplexing for bus control and data signals to provide a multi-master environment. The logic blocks interface to the system bus 46 as either bus masters or as bus slaves depending on their function and some of the blocks in the controller 10; some logic blocks can be both master and slave.

Figure 5:
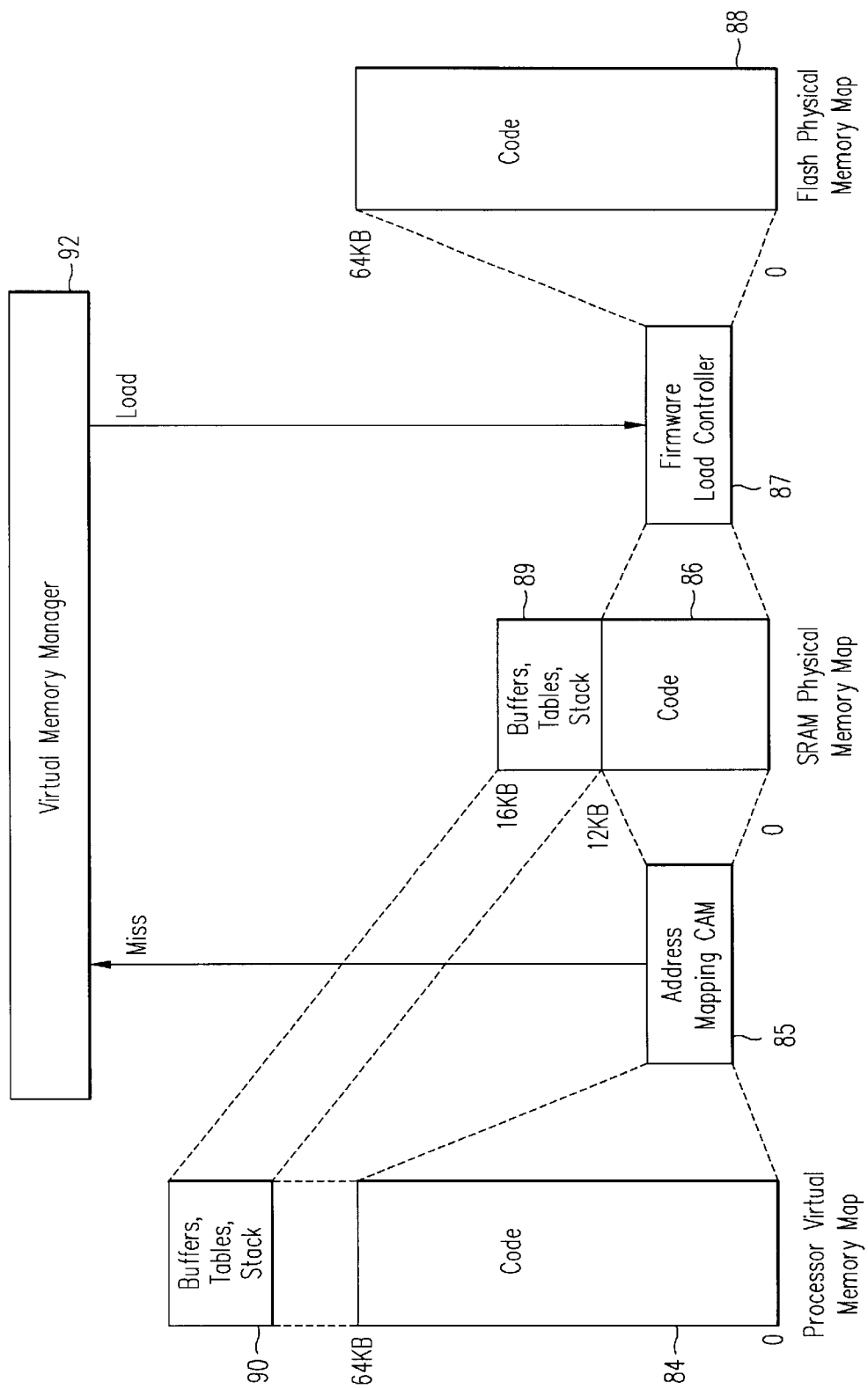
FIG. 5 is a representative block diagram showing the virtual memory mapping provided by the controller of FIG. 1.

Memory access control unit 14 also includes system manager 50 and memory management unit 48. System manager 50 controls the initialization of controller 10 and manages reset conditions after power-up. It also controls the system clocks and the interrupts to microprocessor 18. Memory management unit 48 is responsible for translating addresses generated by microprocessor 18 into addresses for SRAM 12, with a knowledge of which code pages are loaded in SRAM 12. When a required code page is not in SRAM 12, memory management unit 48 generates an interrupt, which will be handled by virtual memory manager firmware 92 (FIG. 5).

The address space accessed by microprocessor 18 is divided into code space and data space. For accesses to code space, memory management unit 48 translates that address bits from the microprocessor 18 which define a code page in it's address space into a lesser number of address bits which define a code page in SRAM 12. This translation is done by address mapping memory CAM 85 (FIG. 5), which is a content addressable memory. CAM 85 has one entry corresponding to each SRAM code page, and each entry may contain the address of a code page which is stored in the corresponding SRAM code page. Individual entries in CAM 85 may be disabled so that the division of SRAM 12 into code space and data space may be varied. When the address of a code page is supplied as input to CAM 85, the address of the SRAM code page in which it is located is returned as output, or a miss signal is generated.

Figure 3:
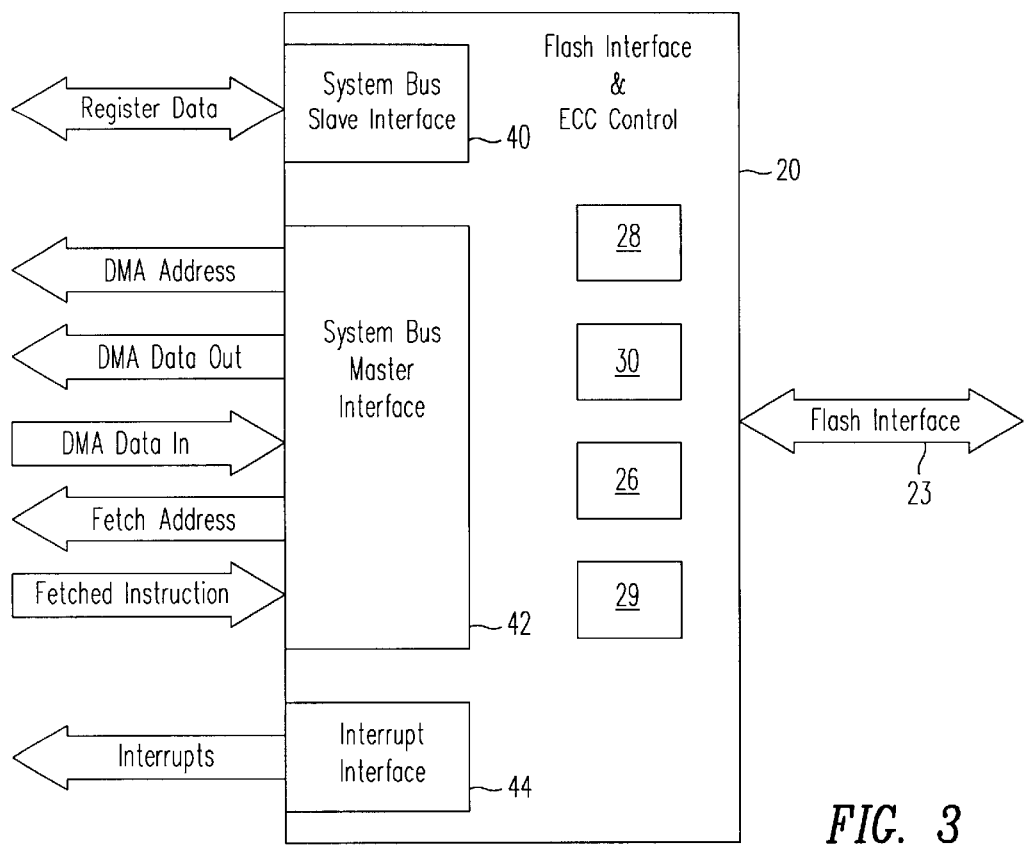
FIG. 3 illustrates the flash interface and ECC control unit of FIG. 2 in more detail.

The flash interface and ECC control unit 20 is a programmable pattern generator which creates control sequences for a wide variety of byte serial Flash devices and comprises configuration sequencer 28, ROM 10 and ECC checker 26 as shown in FIG. 2. With reference to FIG. 3, the unit 20 further defines a slave interface 40 to system bus 46 to allow access by microprocessor 18 to various control and status registers which is required to control the interface to Flash memory 24. A system bus master interface 42 allows data to be transferred by DMA between SRAM 12 and Flash memory 24. This bus master interface 42 also, allows Flash interface block 20 to access a sequence of commands stored in SRAM 12 which may be fetched sequentially to control the operation of Flash interface block 20 in response to a command written to a control register. An interrupt interface 44 allows interrupt signals to be passed to system manager block 50. The register set 29 within Flash interface and ECC control unit 20 comprises control registers, which include command, status and Flash address registers, DMA control registers, which include data in data out and fetch address registers. ECC control registers, ECC control registers which contain ECC syndrome words from the ECC checker 26, timing control registers, which contain parameters controlling timing of operations, and firmware load registers, which include command, status and configuration registers.

During normal operation (see FIG. 4) microprocessor 18 initiates page read, page write and block erase operations in Flash memory 24 by writing to and reading from the control registers of set 29. Flash interface block 20 executes a command written to the command registers of set 29 while fetching a sequence of commands from SRAM 12. Transfer of a code page from Flash memory 24 to SRAM 12 may be initiated by the microprocessor 18 by writing to the firmware load registers of set 29, and takes place totally under hardware control of configuration sequencer 28.

Configuration sequencer 28 also controls configuration of the controller 10 when initiated by system manager 50 immediately after power-up and with processor 18 halted. The configuration information for this operation is stored in ROM 30. ECC checker block 26 generates and ECC syndrome which is stored with every page of user data, control data, and firmware code which is written to Flash memory 24 and checks it when a page is read.

The host interface control unit 16 provides the interface between the controller 10 and the host system 22. A slave interface allows a set of registers to be accessed from the system bus 46, and the bus master capability allows data to be transferred between SRAM 12 and the host 22. The host interface control unit 16 provides support for all aspects of the heat interface protocol.

Shared SRAM 12 provides volatile memory for firmware code and data storage.

Data to the SRAM 12 read or written, through system bus slave interface which is also used to access registers to control the memory management. The actual SRAM, that is the shared SRAM 12, appears several times in the address mapping: once as a virtual memory address space, and once as a physical address space.

Figure 4:
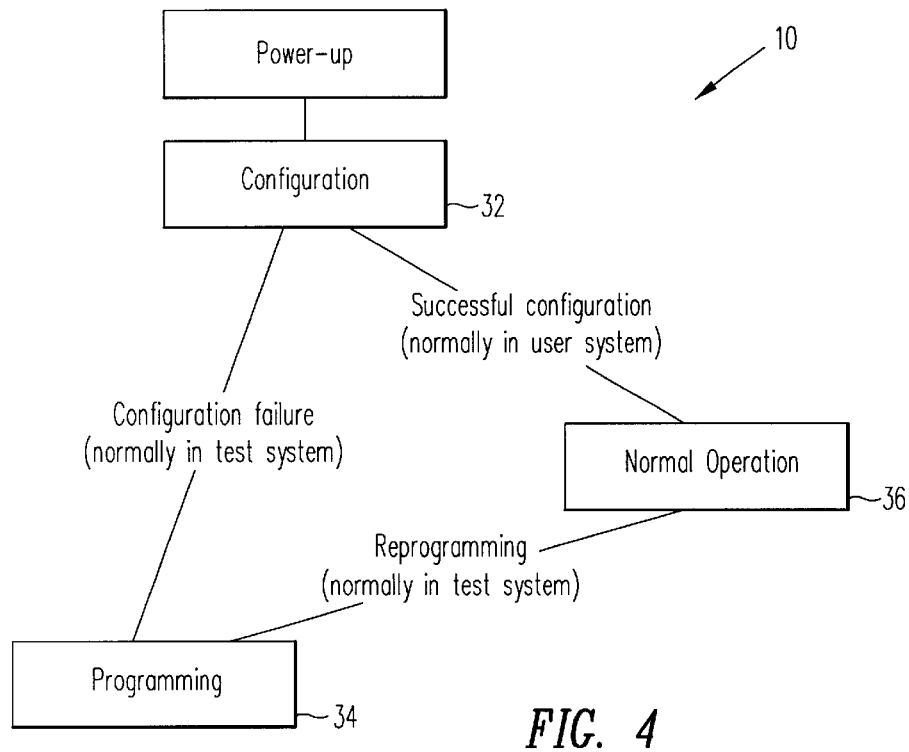
FIG. 4 is a schematic representation of the operating modes of the memory controller of FIG. 1.

With reference to FIG. 4 it can be seen that within the memory system the controller 10 can operate in three different modes, the configuration mode 32, the programming mode 34 and the normal operation mode 36. The system manager block 50 controls the initialization of the controller 10 and manages any reset conditions after power up as well as controlling and interrupts to the processor 18.

The operation of the controller 10 in the initialization or configuration mode 32 will now be described in more detail with reference to FIGS. 1 and 2.

The memory controller 10 enters the configuration mode 32 when power is first applied to the controller 10 with processor is halted. The configuration operation will normally be successful if the memory system is being operated in a user system, but will be unsuccessful if it is in a test system and has never previously and firmware programmed into Flash memory 24. During configuration the controller 10 is responsible for the initialization of the hardware according to the type of Flash chips being used in memory 24. The purpose of configuration is to establish the configuration information for the controller hardware and to load one or more sectors of boot firmware code to the SRAM 12 of the controller 10 from the Flash memory 24.

Configuration is carried out by hardware configuration sequencer 28 in Flash interface and ECC control unit 20 with the microprocessor 18 halted. Configuration sequencer 28 has no conditional branching capability, and is not a microprocessor. The configuration sequencer 28 generates a sequence of operations to load the required firmware pages and makes re-tries in the event of ECC errors. If the maximum number of load attempts is exhausted on any one page then the configuration process is terminated with an error. A status bit from the ECC checker 26 indicates this transfer operation was successful. If successful then once all the required firmware has been loaded the transfer sequencer releases the reset signal from the microprocessor 18, allowing the microprocessor 18 to run, which begins the execution of code which is located in SRAM 12 at the first address of the 512 byte code sector which has been loaded from Flash memory 24, and thus the configuration operation has been successfully concluded.

If the transfer operation was unsuccessful the configuration sequencer 28 will try again by designating an alternative address in Flash memory and initiating a second transfer operation. If the ECC checker 26 indicates the transfer operation was successful, the system manager block 50 releases the reset signal from the microprocessor 18, which begins execution of the loaded code in SRAM 12 and the configuration operation has been successfully completed. If the transfer operation was unsuccessful the above reloading process will be repeated up to a number of attempts, which is predefined in the configuration information stored in ROM 30. If all of these attempts fail, the configuration process is terminated with an error without the microprocessor is being started.

In the event that the configuration process terminates with an error, the processor 18 is not started, but indication of busy status is cleared in host interface 21 so that the firmware upload process may be executed by host 22. The host 22 can detect what the cause of failure was by reading a register in host interface control unit 16 containing a code that is illegal during normal operation.

The programming mode 34 of the memory controller 10 will now be described. Programming of the Flash memory 24 is accomplished by running special programming software on the host 22 which may be a host PC or a test system. The programming may be performed when the controller 10 is in normal operation mode 36 as shown in FIG. 4. However, it may alternatively be performed when the microprocessor 18 is halted following an unsuccessful configuration (32) operation.

Programming is initiated by the host 22 sending a unique program command via the host interface 21 to the host interface control block 16 which is outside the command set specified in the host protocol and is a vendor specific command. A vendor specific command uses a command code value which is not used by any host device 22 during normal operation and is reserved for use by individual manufacturers of Flash memory controllers for specific purposes during, for example, test or programming of a memory system. A number of safety interlocks are required in the form of vendor specific data patterns previously loaded from host 22 to registers in host interface control block 16, which must be present to allow correct interpretation of this program command by the controller 10. The program command puts the host interface control unit 16 into a mode in which executable code can be loaded from the host 22 via the host interface 21 to a defined location in SRAM 12. This operation takes place totally under hardware control.

A second vendor specific command sent by host 22 causes the microprocessor 18 to begin execution of the code loaded to SRAM 12. This code controls the loading of full devices firmware code from the host 22 via host interface 21 to one or more location in Flash memory 24. Each additional location will contain a redundant copy of the firmware code for security. With reference to FIG. 4, after successful conclusion of a configuration operation 32 following power up, the memory system enters normal operations mode 36

While mode 36 is active, it is necessary in some circumstances for one or more sectors of firmware code to be loaded from a specific location in Flash memory 24 to a specific destination location in SRAM 12. The requirement to load a code sector is identified by the memory access control unit 14 which detects when a firmware pate to the accessed by the microprocessor 18 is not resident in the SRAM 12. The requirement to load this page from a source address in Flash memory 24 to a destination address in SRAM 12 is identified by the microprocessor 18 while executing code already located in SRAM 12.

The transfer of a code page is initiated by the microprocessor 18, while executing code already in SRAM 12 by writing code page and SRAM code page numbers, plus a command code, to the firmware command register n Flash interface and ECC control unit 20. The triggers a code page load operation from Flash memory 24 to SRAM 12 under control of configuration sequencer 28.

With reference to FIG. 5 there is shown a representative block diagram of the virtual memory mapping provided by the controller 10 of the present invention. The processor 18 of the controller 10 has access via the SRAM 12 to up to 64 KB of virtual address space in which the firmware code is located. This virtual address space represents the same capacity of physical Flash memory 24 in which the firmware code is actually stored and which is accessible through a much smaller capacity memory, in this case 12 KF of SRAM 12 in the controller 10.

The firmware code is partitioned into virtual code pages, each of which is 512 bytes long. The complete set of virtual code pages is stored in Flash memory 24 in corresponding set of Flash code pages. The SRAM 12 has capacity for up to 24 SRAM code pages, which may be loaded individually from Flash code pages within the Flash memory 24. Mapping of the virtual code pages to SRAM code pages is maintained in address mapping CAM (Content Address Memory (85). When the processor 18 accesses an address in virtual code space 84, the virtual page address is applied to the CAM 85, which retains the SRAM page address in the SRAM page address from the SRAM physical memory map 86. If the CAM 85 indicates that the virtual code page is not present in the SRAM physical memory map 86, a signal is returned to the virtual memory manager 92 indicating that a miss has resulted from the virtual code page fetch operation. The virtual memory manager 92 then controls the loading of the target Flash code page from the Flash physical memory map 88 to an SRAM code page in the SRAM physical memory map 86 which is then accessed by processor 18. The virtual memory manager 92 is itself implemented as firmware code by microprocessor 18. It may alternatively be implemented totally in hardware by a virtual memory manager hardware block within controller 10.

The virtual memory manager 92 controls the strategy for selection of a code page for replacement in SRAM 12 when another page has to be loaded from Flash memory 24. A simple sequential strategy is implemented by the virtual memory manager 92 wherein pages in SRAM 12 are replaced sequentially on the basis of physical address order within the SRAM 12. Other replacement strategies bay be employed. For example, the least recently used page in SRAM 12 may be replaced. The virtual memory manager 92 is also provided with the capability to lock any code pages which should remain permanently resident in SRAM 12 causing them to be passed over for replacement. An example of locked code pages is code pages containing firmware code for virtual memory manager 92 itself.

It will be seen from the above that the virtual memory mapping provided by the controller 10 provides a means for making a high virtual memory capacity available to the processor 18 or the controller 10 by controlling the loading of firmware code pages from an area of Flash memory 24 to a much smaller SRAM memory 12 within the controller 10 which is accessible by the processor 18.

During the configuration of the controller 10 it has been detailed how a small internal ROM 30 provides configuration data to control the hardware operation. However, the provision of an 12C serial interface allows an external EEPROM to be used as an alternative source of the configuration date.

As has been described programming of the system may be achieved by running a special program in software in host PC. However, programming may also be achieved by a host system.

Examples have been given of Flash memory being physically divided into NAND flash pages of 528 bytes. However, it should be noted that for a 256 Mbit AND Flash memory the flash pages are 2112 bytes in size.

In the examples given information is written to or read from Flash memory 24 in units of page or sector which memory 24 is defined as a sub-division of a single chip. However, a page or sector need not be a physical subdivision of a flash chip, and may also be distributed across two or more Flash chips.

During the operation of the configuration sequencer 28 operating sequences have been described as being started by the configuration sequencer 28 requesting a page of firmware to be loaded into SRAM 12. However, the operating sequences may alternatively be started by a write signal being input into a control register. During normal operation the configuration sequencer registers are available to the processor 18 to allow access to an external EEPROM if fitted.

A preferred form of Flash interface controller 20 will now be described with reference to FIGS. 6 to 10.

Because the Flash Memory Array 24 may be constructed from devices of various types and from various manufactures, the nature of the interface 23 between the controller and the Flash Memory Array 24 will vary from product to product. The Flash Memory Controller 20 provides the means for the Controller 10 to communicate with a wide variety of Flash memory devices. The embodiment described with reference to FIGS. 6 to 10 supports Flash memory devices that have a byte serial interface with a number or other lines to control the transfer of commands and data. It will however by understood that the range for the embodiment described includes all current Flash memory devices that are intended for data storage in block structures. Additionally, with minor modification the concepts could be applied to a wider range of Flash memory devices such as those with a random access architecture though this would increase the number of pins on the Controller device (as will be explained).

Each of the devices in the Flash Memory Array 24 requires a unique chip select line to indicate when the Controller 20 is communicating with that device. To keep a low number of pins on the Controller 20 it is desirable to keep the number of select lines to a minimum, however this reduces the maximum number of Flash devices that the Controller 20 can communicate with. To resolve this issue, the Flash Memory Array 24 may be designed to decode chip select lines in circuits external to the Controller 20, in this mode of operation the function of the Controller chip select pins is modified.

The System Bus 14 provides a means for all the hardware blocks within the Controller 10 to communicate and has a multi-master architecture so each block may be a Bus Master, a Bus Slave or both. A Bus Master may initiate reading of data from, or writing data to, a Bus Slave hardware is provided that controls the System Bus 14 such that at any given time there is one and only one Bus Master, the current Bus Master determines which, if any, Bus Slave is being accessed. The Flash Memory Controller has Bus Master and Bus Slave capability, the Processor is a Bus Master, the Ram is a Bus Slave and the other hardware may be Bus Masters, Bus Slaves or both.

Figure 6:
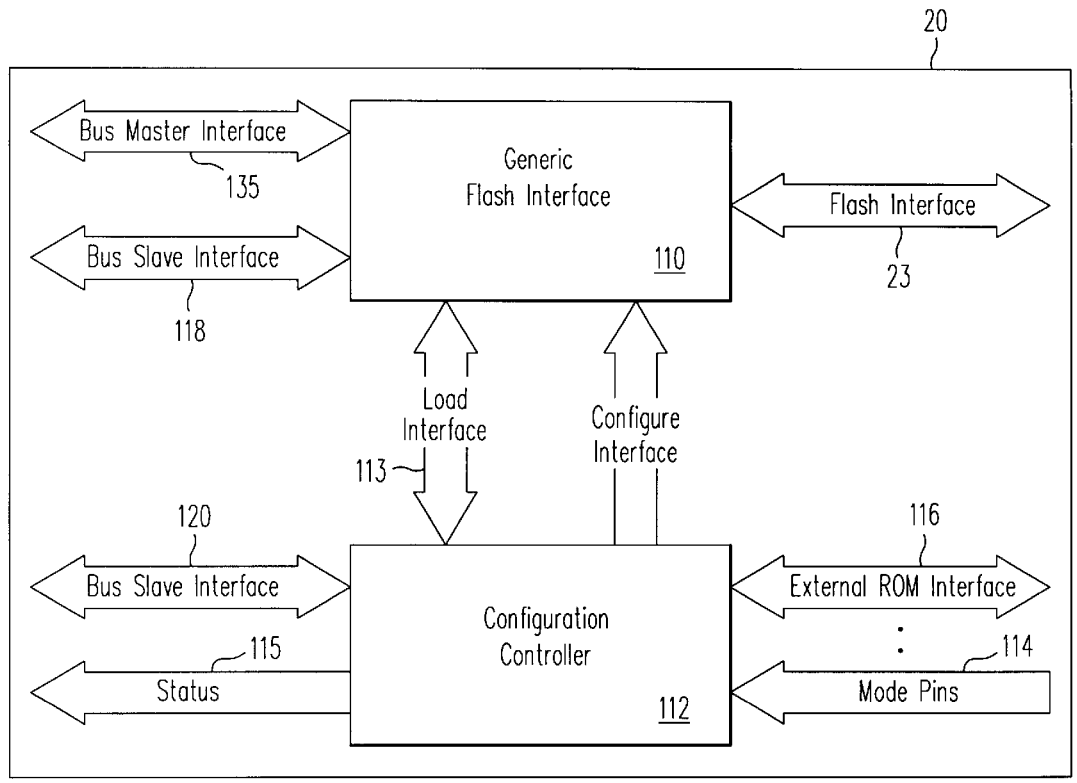
FIG. 6 illustrates the preferred form of a component of the FIG. 1 system in greater detail.

FIG. 6 shows the preferred structure of the Flash Memory Controller 20. There are two mail blocks that allow the Flash memory Controller 20 to communicate with a wide range of Flash types and for the Flash Memory Controller 20 to autonomously configure itself at power on. The Generic Flash Interface (GFI) 110 controls the Flash Interface 23 to transfer data in either direction between the Flash Memory Array 24 and RAM 12 via the Bus Master interface 14. The Configuration Controller 112 initializes various registers with values that configure the GFI 110 for operation with the type and number of Flash memory devices that make up the Flash memory Array 24. The Configuration Controller 112 identifies what type of Flash memory devices are connected by reading the Mode Pins 114. The Mode Pins 114 indicate where to obtain the configuration data that allows the Flash Memory Controller 20 to autonomously copy a number of pages of data from Flash Memory 24 to RAM 12. Configuration data is located either in a small mask programmed ROM within the Configuration Controller or in an external ROM that is accessed via the External ROM Interface 116. In the embodiment described here 4 pins 114 are used to select between 8 configuration options stored in the internal ROM or 2 of the same pins are used to control in 12C EEPROM via interface 116.

Configuration data is limited to 128 bytes and comprises register initialization data and GFI Commands, each block of information is protected by a simple checksum. Initialization data is used to set up the Configuration Controller 112 and the GFI 110 so that the sequence and timing of signals on the Flash Interface 23 are consistent with the type of Flash Memory devices used. The FGI Commands define the sequence of operations on the Flash Interface 23 that are required to copy a page of data from the Flash Memory Array 24 to RAM 12.

The Flash Memory Controller 29 operates in two modes. Ad power on the Flash Memory Controller 20 is in initializing mode, once initialization completes the Flash Memory Controller 20 operates in normal mode. During initialization the configuration registers, in the GFI 110 and the Configuration Controller 112, are initialized and a quantity of data copied from the Flash Memory Array 24 to RAM 12. The Flash Memory Controller 20 indicates whether the initialization has completed without error by setting the state of the Configuration Controller 112 status. Typical errors would be that there was a checksum error in the configuration data or that the data transfer from Flash 24 to RAM 12 failed. During normal operation, assuming that configuration has completed successfully, the Flash Memory Controller 20 may be programmed via its Bus Slave Interfaces 118.120 to perform any operation on the Flash Interface 23. Typical operations in normal mode might be reading data, writing data, erasing data or reading Flash device status.

In the embodiment described, the data that is initially copied from the Flash Memory Array 24 to RAM 12 is the initial set of firmware instructions that the Processor 18 will execute. Consequently the full operating capability for the FGI 110 is defined by data stored in the Flash Memory Array 24 that it controls.

Figure 7:
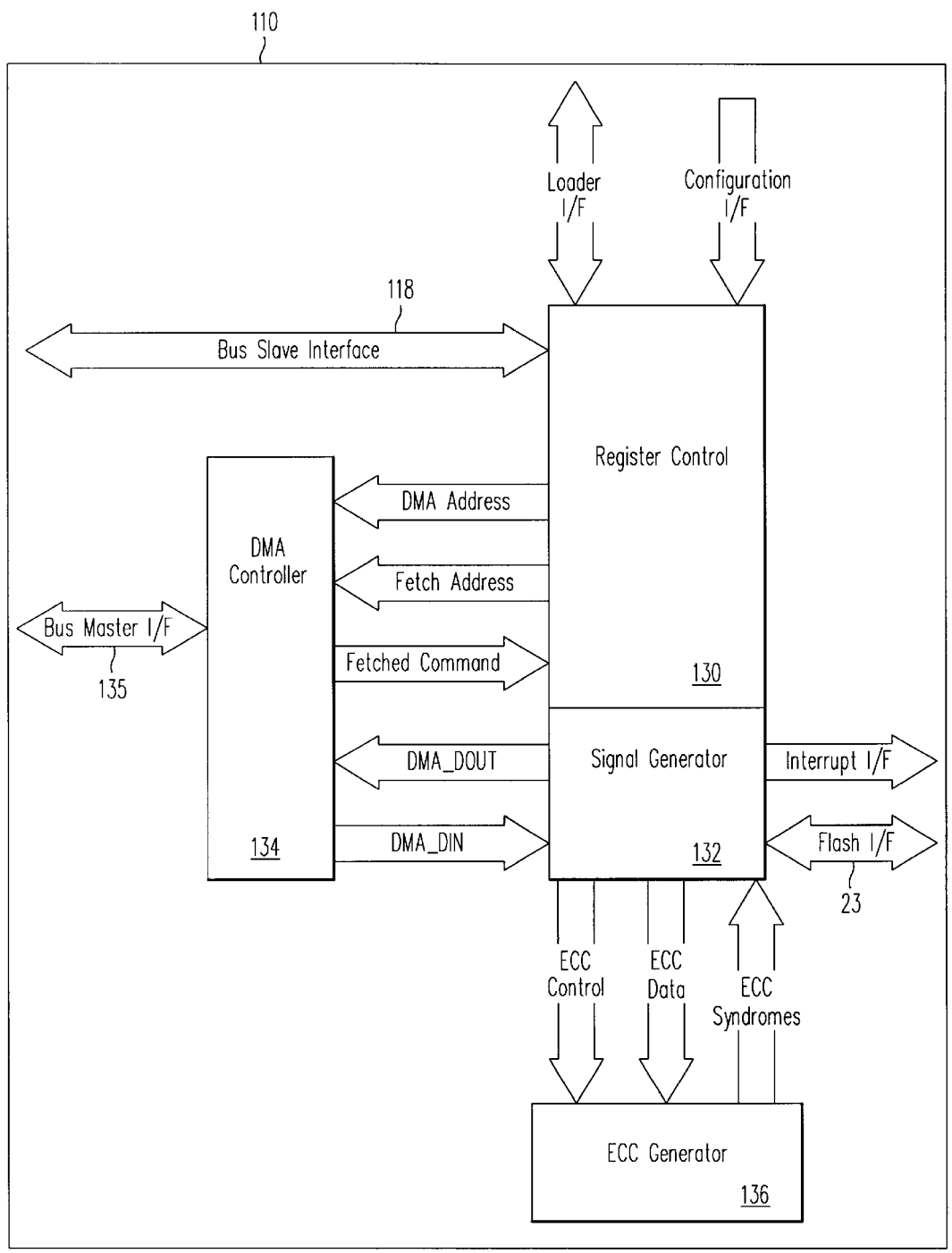
FIG. 7 illustrates a first aspect of FIG. 6 in greater detail.

FIG. 7 shows the general structure of the GFI 110. A Register Control 130 block that are used to control the operation of a Signal Generator 132. A DMA Controller 134 provides the System Bus Master capability for the GFI 110. An ECC generator 136 is used to generate and check Error correcting Codes for data stored or read from the Flash Memory Array 24.

A Register Control Block 130 includes a number of registers that may be read or written via the GFI Bus Slave Interface 118. Table 1 lists registers, their width in bits, the access allowed (read and/or write) and whether the register is initialized by the Configuration Controller 112 at power on or reset. The Function of each register should become clear from the subsequent description.

The Signal Generator 132 is used to create waveforms on the Flash interface 23 that correspond to the timing diagrams for the Flash memory device used. To achieve this, the Flash interface 23 is partitioned into several groups of signals, namely Data, Level, Clock and Reset carried on lines.

There are 8 bi-directional Data signals. Flash Memory devices transfer command, address and data information over these lines.

There are 2 level signals that are output only and generally are used to indicate the current mode of the Flash Interface 23, i.e. what information is being transferred on the Data lines.

There are 2 Clock signals that output only, pulse high or low, and are used to time the transfer of information on the Data lines.

There is 1 Reset signal that is used to disable the Flash memory devices when the Flash Memory Controller 20 is reset. When the Flash Memory Controller 20 reset is linked to power supply voltage then this protects against data corruption during power transitions.

Different embodiments might allocate different numbers of signals to these groups. An embodiment that needs to control random access Flash memory devices might needs to add an extra signal group to implement address lines, this is not necessary in the embodiment described because address information is transferred on the same signals as data and command information.

Figure 8:
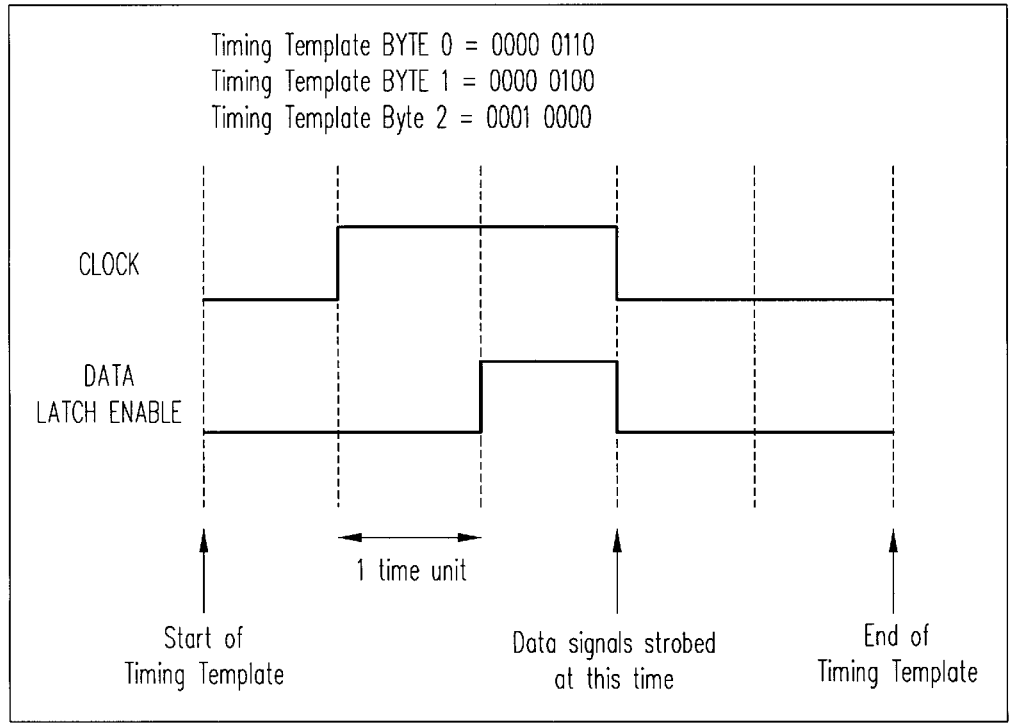
FIG. 8 illustrates waveforms useful in understanding FIG. 7.

All Flash interface 23 signals change state on the rising edge of a master Flash Memory Controller clock. Flash device control sequences are constructed from smaller sequences that are known as Timing Templates. FIG. 8 provides an example of how a Timing Template relates to the timing of signals on the Flash Interface 23. The Timing template determines when Clock signals are active and when data should be latched for reading. A prescale counter generates time units for the Timing Template from the master Flash Memory Controller clock, a time unit can be 1–16 master clock periods A Timing Template is defined by the contents of 3 bytes stored in a register. The first byte of the Timing Template defines the time units when Clock signals are active, the second defines which time units are used to sample the Data signals and the third byte is used to set the number of time units in the timing template. The state in each time unit is defined by a corresponding bit in each byte of the Timing Template.

The embodiment described provides a set of a Timing Templates, other embodiments may require a different number. The Timing Template registers are initialized at power on by the Configuration Controller 112 but may be updated by way of the GFI Bus Slave interface 118. The prescale setting is defined in the Prescale register, this register also includes fields to define whether Clock signals pulse low or pulse high and whether chip select lines are decoded internally or externally.

The execution of a Timing Template is started by a write to the GFI Command Register, this can occur in 3 ways; the Configuration Controller 112 writes via the Loader Interface 113, the register is written via the GFI Bus Slave Interface 118, or the DAM Controller 134 fetches a command. The first two methods are similar and are described first.

A Timing Template on its own is not sufficient to define how all the signals behave, full control is defined by a GFI Command. A GFI Command is a 32-bit word that is written to the GFI Command Register. These Commands may be Cycle Commands or Load Commands, the format of each type is shown in Table 2.

Some combinations of field values are not sensible, but these do not need to be precluded by the hardware implementation. An example of such a combination would be to set up a burst operation to write a constant to Flash, this is not sensible because the command data field is used to define both the burst length and the data written.

The format of a LoadCommand is shown in Table 3. LoadCommands cause the data in the value field to be written to the specified register. The target registers are the same registers as those listed for the Register Controlblock 130.

In the embodiment described the number of bits in each GFI command conveniently matches the system data bus width. In systems with narrower system buses or wider Command words it would be possible to divide the Commands across multiple words.

Complete Flash memory operations are generated by writing a sequence of GFI Commands to the FGI Command Register. Once each GFI Command is written a status bit is set in the GFI Status register to indicate that the GFI is busy, this bit is cleared once the Timing Template has completed and if required, the Flash Ready signal is high. Writes to the GFI Command Register are ignored when the GFI is busy.

If Flash Interface 23 operations are constructed by writing Commands via the GFI Bus Slave interface 118 then there will be a significant time overhead between Commands because the GFI Status Register must be polled between commands. This time overhead is removed by setting up a sequence of Commands in RAM 12 and allowing the DMA Controller 134 to fetch them on demand. Such a sequence of Commands is started by writing to the GFI Fetch Address register either directly, via the GFI Bus Slave Interface 118, or indirectly by way of a Load command. When the GFI Fetch Address register is written to, the DMA controller 134 starts to fetch commands from RAM 12 at the address specified, Commands are fetched from successive addresses until the last command flag in a Command is set. The GFI Status register shows the GFI 110 to be busy from the time that the GFI Fetch Address register is written until the Command with the last command bit set has completed. The GFI 110 supplies its busy status and the Flash Ready signal for use by an interrupt manager elsewhere in the Controller 10.

There sequences of Commands allow entire Flash operations to be constructed without direct involvement of a processor to sustain the Flash Interface 23 activity. The same sequence of Commands can be used to operate at any address in Flash memory 24 bus setting up the Flash Address registers and then writing to the GFI Fetch Address register. During execution of the sequence the actual address bytes are generated by referencing bytes in the Flash Address register. The Flash Address registers may be written directly via the Bus Slave Interface 118 or indirectly by executing a Load Command.

Many Flash memory operations require the transfer of data to or from the Flash Memory Array 24. In most cases this data will originate, or end up, in RAM 12, however there are cases when it is necessary to write ECC Syndrome data to Flash memory 24, read data from Flash memory 24 to the ECC generator without writing the data to RAM 12 or transfer a status byte from Flash Memory 24 to the GFI Status register. Transfer to or from RAM 12 are achieved by selecting the DMA Controller 134 in the data source sink field of Cycle Command. The DMA controller 134 carries out the task of transferring data to or from RAM 12.

Data is transferred to and from RAM 12 via the Bus Master Interface 135. In the embodiment described this data path is 32 bits wide though other embodiments could use wider or narrower buses. The data path to Flash Memory 24 is only 8 bits wide. Conveniently all data transfer to or from Flash memory 24 consist of data blocks that have a length that is a multiple of 4 bytes, if this were not the case the DMA hardware 134 might need to be more complex. Operation for read and write is slightly different.

For operations that write data to Flash memory 24, the DMA Controller 134 reads data from RAM 12. Reading starts whenever the DMA Read Transfer register is written, this can be via the GFI Bus Slave interface 118 or as a result of a Load Command. The value written sets up the address in RAM 12 where the data is located and this must be on a 4 byte address boundary. The DMA Controller 134 then requests access to the bus 14 so that the first 4 bytes can be read. Once these bytes have been read the data is available to the GFI 110 for transfer to the Flash memory 24, DMA 134 controller also initiates the transfer of the next 4 bytes of data. The DMA controller 134 satisfies requests for data for transfer to Flash memory 24 by supplying one byte at a time from its buffer. When the last byte has been transferred, the data from the second read of RAM 12 is transferred to the main buffer and the process repeats. If for any reason the DMA controller 134 is unable to fetch data from RAM 12 as quickly as the data is transferred to Flash memory 24 then the Signal Generator 132 is halted until data is available.

For operations that read data from Flash memory 24, the DMA controller 134 writes data to RAM 12. The starting address for storage of data is setup by writing to the DMA Write Transfer register. Data is read from Flash memory 24 one byte at a time. As data is read from Flash-memory 24, the DMA controller 134 assembles a 4 byte word in buffer. When the buffer is full the data is transferred to a second buffer so that the next word can be assembled. Whenever data is transferred to the second buffer the DMA Controller 134 requests access to the System Bus 14 and writes the contents of the second buffer to RAM 12 and then increments the address in the DMA Write Transfer register ready for the next write. If for any reason the second buffer has not been written to RAM 12 by the time that the first buffer is filled then the Signal Generator 132 is halted until there is space in the first buffer.

The Configuration Controller 112 provides three functions. First is the initialization of certain registers with data appropriate to the type of Flash memory connected to the Controller 10. Second is the autonomous copy of a certain amount of data from Flash memory 24 to RAM 12. Third is the means to initiate further copying of data from Flash memory 24 to RAM 12. In the embodiment described the data that is autonomously copied from Flash memory 24 to RAM 12 is firmware for execution by a Processor 18 through it would feasible to use the same concept to copy data of a different type.

Figure 9:
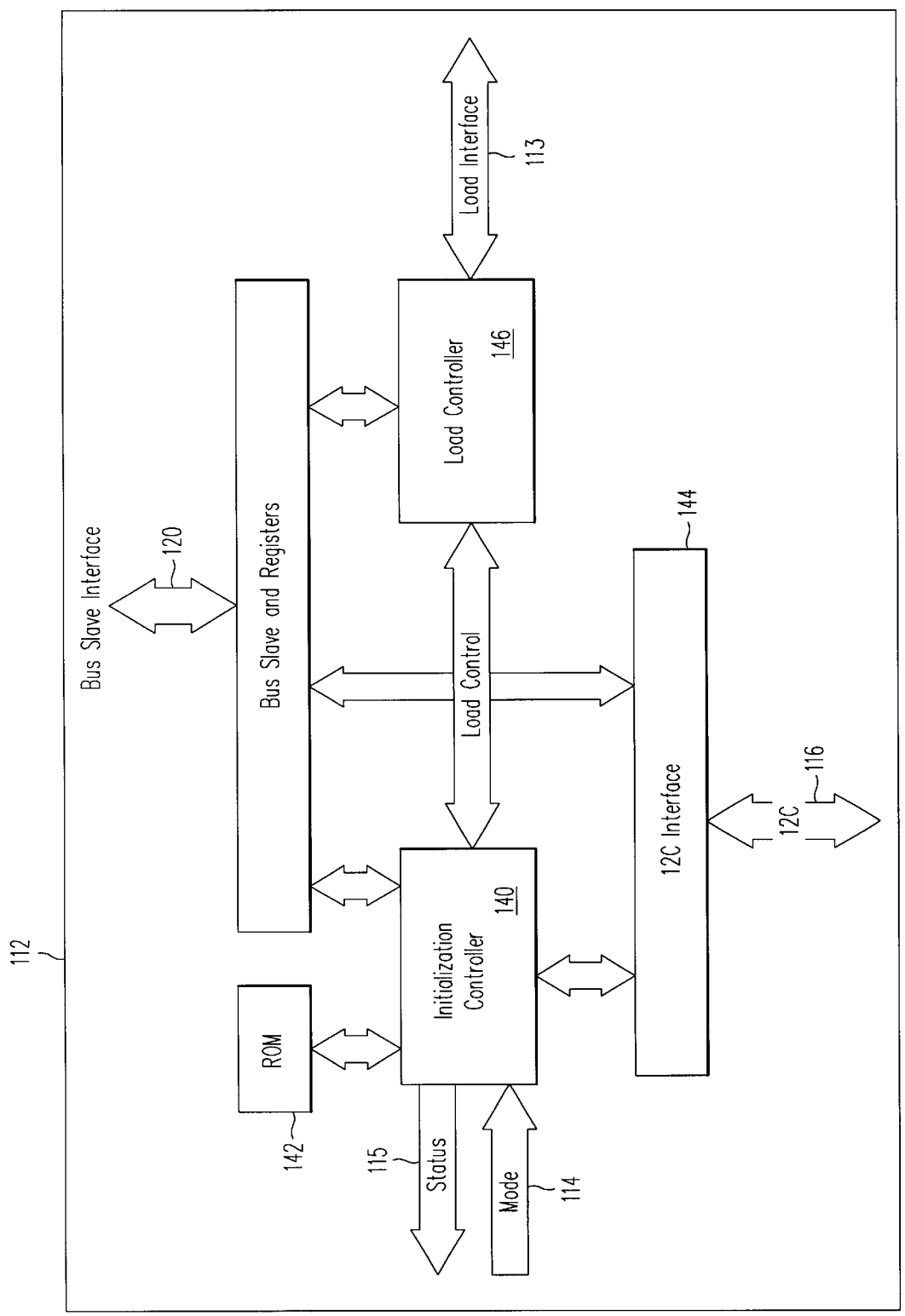
FIG. 9 illustrates a second aspect of FIG. 6 in greater detail.

As is shown in FIG. 9, the configuration controller 112 comprises an Initialization Controller 140, which coordinates the initialization of Flash Memory controller registers and the initial copy of data from Flash memory 24 to RAM 12. The initialization data for Flash memory controller registers is held in either an internal ROM 142 or an external EEPROM that has a serial interface. The ROM 142 includes 8 sets of initialization data while an external EEPROM only includes one set of data. The Initialization Controller 140 locates the source of initialization data by checking the state of 4 Mode pins 114. The first pin indicates whether the initialization data is stored internally or externally. For internal initialization data the remaining mode pins select which set of data to use, while for external initialization data the remaining pins are used for the serial interface 144.

Once the various registers have been initialized, the initialization Controller 140 interacts with Load Controller 146 to manage the copying of data from Flash memory. The Load Controller 146 issues Load Commands to the GFI 110 via load interface 113 to set up target addresses in Flash memory 24 and RAM 12 before writing to the GFI Fetch Address register to start a Flash read. The Load controller 146 waits for the GFI 110 to complete the read operation before starting the next read.

Once all data is copied from Flash the Configuration Controller 112 enters its normal mode. In this mode the Initialization Controller 140 is idle and the Load Controller 146 responds to register accesses via the Bus Slave Interface 120. The registers that can be accessed via the System Bus Slave interface 120 are listed in Table 5.

During the register initialization phase the Initialization Controller 140 reads the selected source of initialization data a byte at a time and writes each byte to the appropriate register. The method used for getting data to the correct register is to connect all registers to a common byte wide data bus and a common write enable signal. A register select token is then passed from register to register, the register that has the token when the write enable signal is active takes the data on the common bus. Token passing occurs after each register write. This method for distribution of initialization data removes the need for address decode and allows the set of registers that can be initialized to be easily expanded into other parts of a system such that each part of the initialization chain may be designed without knowledge of other components in this system.

Actual initialization data in the ROM 142 or EEPROM is prefixed by a byte that is always hexadecimal 55, this allows the initialization Controller 140 to quickly identify an unprogrammed external EEPROM. If the first byte is not hexadecimal 55, then the initialization process is terminated and an error reported on the Configuration Controller status 115. The initialization data follows the prefix byte and then there is a check byte to verify the integrity of the data. Four initialization data bytes are retained in the Configuration Controller 112, the rest is passed on to the GFI 110. The configuration Controller 112 terminates the initialization data stream when the write token returns, at this point the checksum is verified. A checksum error causes the initialization process to halt and an error is reported on the configuration Controller Status 115. The four bytes of initialization data that are used by the Configuration Controller 112 are shown in Table 4.

The data in the first two bytes is only used during the initialization process. The ClkPsel field defines the clock division factor for an external EEPROM, the default value assumes that the maximum master clock frequency is being used, but once this field has been read from a EEPROM a more appropriate division ratio is used. The NumPages field defines how many pages to copy from Flash 24 to RAM 12, the field actually defines the number of pages to load after the first. The Sequence field defines the number of GFI Commands in the sequence that copies the first page of data from Flash Memory 24 to RAM 12.

The second two bytes initialize parameters that define the architecture of the Flash memory devices and the number of copies of data in the Flash Memory 24. The usage of these fields is defined in the description of the data copying process below. Data copying starts once the initialization data has been transferred from ROM 142 or EEPROM to the various configuration registers and proceeds in two phases, load of the first page and load of subsequent pages. The two phases are similar but differ in one major aspect.

The embodiment described allows for 64K bytes of data that is stored in Flash memory 24 that may be copied to RAM 12 by the Configuration Controller 112. There may be more than one copy of the data so that the system can tolerate defective blocks in the Flash memory 24. This embodiment allows for a maximum of eight copies, the actual number is set up in the Retries field of the initialization data. The data is divided into pages of 512 bytes, the Configuration Controller 112 has the capability to copy any of the data pages from Flash memory 24 to any area of RAM 12. During the initial copy the first pages are copied to the start of the RAM 12, the actual number of pages copied is defined by the NumPages field in the initialization data.

The type of Flash memory devices used, store data in pages that have a size which is a multiple of 528 bytes, common sizes are 528, 1056 and 2112 bytes to avoid confusion the term Data Page is used to refer to a block of 512 bytes that are available to be copied into RAM. RAM Page refers to a 512 byte block of RAM that is aligned on a 512 byte address boundary. Flash Page refers to a physical page in the Flash Memory. Flash Data Page refers to a 528 byte block in a Flash memory device that includes a Data Page and 16 bytes of header and ECC information. Some Flash memory devices store more than one Flash Data Page in a Flash Page.

The Flash Memory Array 24 consists of one or more Flash memory devices, the Data Pages for copying may be stored in 1, 2, 4 or 8 of these. Table 7 shows how Data Pages are allocated to Flash memory devices as the number of devices varies. For the purposes of determining this allocation, a Flash memory device 24 may be considered to be a separate Flash chip or a separately addressable region of a chip, in this latter case a single chip may contain more than Flash memory device.

The number of Flash memory devices used for storage of Data Pages is defined by, the NumChips field that is located in the LOADCFG register. At power on, NumChips is initialized to 1 and can be updated by a write to the LOADCFG register but, this can not occur until the automatic copy has completed. Consequently the maximum value for NumPages is 15, giving a maximum of 16 pages copied automatically during initialization. An alternative embodiment could define the initial value of the NumChips field as part of the initialization data, but this would mean that a new set of configuration data would be required for each different number Flash memory devices in the Flash Memory Array.

Data may be stored in more than one location in Flash memory to provide tolerance against Flash memory defects. Regardless of the number Flash memory devices used, each copy of a given Data Page is stored in the Flash memory device with a separation of 2048 Flash Data Pages.

The Load Controller 146 first attempts to copy the first copy of the first Data Page to the first RAM Page. The process is implemented in hardware and starts by generating a set of bytes that can be transferred to a Flash memory device during the addressing phase of a read command. The address in Flash Memory is a function of the Data Page number, the copy number, the number of Flash memory devices used to store Data Pages and the size of a Flash Page.

Figure 10:
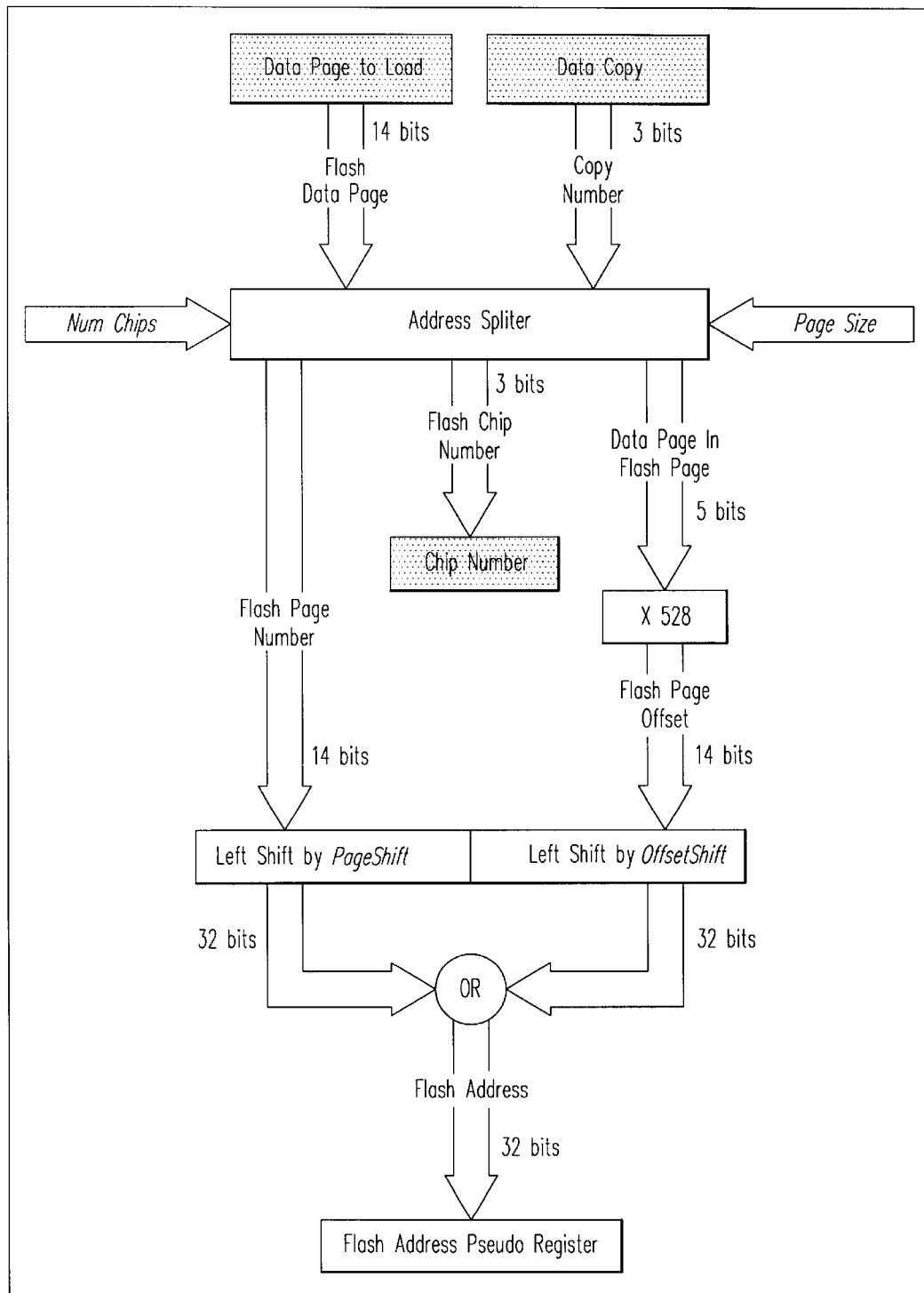
FIG. 10 is a flow diagram useful in understanding FIG. 9.

FIG. 10 shows how the Flash memory addresses calculated. The first step determines a chip number from the Page number and the NumChips configuration value. The Flash Page number and Data Page in Flash Page are calculated as follows.

The Flash Data Page number for the first copy of the data is derived from the Data Page number and the NumChips configuration value the Flash Data Page number is then adjusted to the required copy by adding 2048 times the Copy number, this is a trivial operation in binary arithmetic. The resulting Flash Data Page number is split into a Flash Page number and a Data Page in Flash Page using the Page Size configuration value. Data Page in Flash Page is multiplied 528 to give a byte address within the Flash Page where the required Data Page is located. By limiting the scope of the hardware to support Flash memory devices with no more than 32 Flash Data Pages per Flash Page the multiplication by 528 is a trivial operation that only requires shifting and merging to generate a result.

Flash memory devices are addressed by transmitting a series of bytes at the start of a command, the address includes a page number and possibly an offset within that page. Where both types of address are supplied it is possible that a single byte could contain part of each address component. The second part of the address generation shifts these two components of the Flash address so that they do not overlap and then uses a bitwise pseudo register. The magnitudes of the two shifts are selected such that the required address bytes can be identified in the 4 bytes of the pseudo register through not necessarily in the order required for Flash memory addressing.

The 4 bytes in the address pseudo register are transferred to the GFI Flash Address register by issuing 4 Load Commands via the Load Interface. These bytes are then available to the Cycle Commands when the Flash transfer starts. The calculated chip number is written to the Chip Select register, also using a Load Command.

Once the address and chip number have been sent to the GFI 110 the ECC generator 135 is reset by writing to the ECC Reset register and the target address in RAM 12 is set up by writing to the DMA Write Transfer register, both via LoadCommands. The GFI 110 is not ready to respond to a sequence of commands. The Load Controller 146 issues a final Load Command to write to the GFI Fetch Address register, the address written decodes to the start of the CMDSEQ space of the Bus Slave interface. During this time the Initialization Controller 140 prefetches bytes from the ROM 14 or EEPROM to make up 32-bit commands that will be read via the Bus Slave Interface 120. If the Initialization Controller 140 has not assembled a complete Command when a read is attempted, wait states are inserted on the bus until the Command is ready.

SeqLength field determines the number of Commands that would be read via the Bus Slave Interface 120. If the Load Controller 146 indicates that the Data Page copy has completed before all Commands have been read or if more reads are made after the last Command then an error is reported on the Configuration Controller status 115.

At the end of the Command sequence stored in ROM 142 of EEPROM there is a Load Command that writes to the ECC Check register, this causes the ECC syndrome registers to be tested for zero and a status line set up on the Load interface 113. There is a line on the Load Interface 113 that indicates when the GFI 110 is busy. The Load Controller 146 waits for the Command Sequence to complete and then checks the ECC status. If the ECC does not indicate an error then the Data Page is deemed to have been successfully copied. If an error has occurred then the Command fetch logic is reset and the operation is repeated for the second copy of the Data Page. This repeats until a copy of the first Data Page is successfully copied or all retries have been exhausted. If all retries are exhausted then an error is reported on the Configuration Controller status 115 and initialization halts.

The first Data Page includes the Command Sequence for the transfer of the second and subsequent Date Pages, this has three benefits. First, if an external EEPROM is used as the source of configuration data then Commands can be fetched more quickly from RAM. Second, this technique means that the Command sequence stored in ROM or EEPROM needs to support only the first page, typically this would require the Flash memory device to be initialized in some way. Storing the Command Sequence for the second page load means that this initialization can be skipped, other optimizations may also be made. Finally by using a sub-optimal sequence for the first page it may be possible to support a wider range of Flash memory devices from a single set of configuration data.

Coping second and subsequent Data Pages is similar to the process for copying the first page except that the GFI Fetch Address is set up to be a predefined location in the first RAM page. If any of the Data Pages contain an error in all copies then the initialization process halts and an error code is output on the configuration Controller status.

Once all the required Data Pages have been loaded the reported on the Configuration Controller status 115, it is possible for the initialization process to never terminate if the first Data Page includes an invalid Command Sequence. To protect against this, a hardware timer causes the initialization process to be halted if it does not complete in a reasonable time, the timer is set for approximately twice the maximum initialization time. Once the initialization process has halted the registers may be accessed via the Bus Slave Interface 120.

The LOADCFG register starts the copy of a DataPage from Flash to RAM. The LOADCMD register includes fields to specify the target RAM Page, the Data Page and the copy to use for the first attempt.

The LOADSTS register includes status bits to indicate whether the Load Controller is busy, the outcome of the last Data Page copy and the copy number that was loaded if successful.

The 12C-CTRL register allows the serial interface to an external EEPROM to be manipulated so that it can be read or programmed by the Controller.

The CMDSEQ addresses are not accessible once initialization has completed.

Although the present invention has been described in terms of specific embodiments it is anticipated that alterations and modifications thereof will no doubt become apparent to those skilled in the art. It is therefore intended that the following claims be interpreted as covering all such alterations and modification as fall within the true spirit and scope of the invention.

What is claimed is:

1. A non-volatile memory system comprising:

non-volatile memory for storing firmware for starting up the system and for normal operation of the system;

a controller coupled to the non-volatile memory for controlling the same and including, volatile memory; and a processor coupled to the volatile memory wherein the controller is adapted to operate during initialization or configuration of the system so that the start up firmware stored in the non-volatile memory is loaded into the volatile memory under the control of the controller and with the processor halted, the start up firmware in the volatile memory being subsequently executed by the processor.

2. A non-volatile memory system as recited in claim 1 wherein the volatile memory is of a size such that only a portion of the total firmware located in the non-volatile memory can be stored in the volatile memory at any one time, said portion being sufficient to accommodate the start up firmware.

3. A non-volatile memory system as recited in claim 1 wherein the controller is adapted to operate after start up such that the firmware code executed by the processor from volatile memory from time-to-time loads further firmware code from the non-volatile memory to the volatile memory for subsequent execution by the processor.

* * * * *